United States Patent
Griñó et al.

(10) Patent No.: US 7,573,734 B2
(45) Date of Patent: Aug. 11, 2009

(54) MAGNETOELECTRIC DEVICE AND METHOD FOR WRITING NON-VOLATILE INFORMATION INTO SAID MAGNETOELECTRIC DEVICE

(75) Inventors: Josep Fontcuberta I Griñó, Barcelona (ES); Florencio Sánchez Barrena, Bellaterra (ES); Xavier Matí I Rovirosa, Bellaterra (ES); David Hrabovsky, Bellaterra (ES); Vladimir Laukhin, Barcelona (ES); Vassil Skumryev, Barcelona (ES)

(73) Assignees: Consejo Superior De Investigaciones Cientificas, Madrid (ES); Universitat Autonoma De Barcelona, Bellaterra-Barcelona (ES); Institucio Catalana De Recerca I Estudis Avancats, Barcelona (ES)

(*) Notice: Subject to any disclaimer, the term of this patent is extended or adjusted under 35 U.S.C. 154(b) by 98 days.

(21) Appl. No.: 11/777,623

(22) Filed: Jul. 13, 2007

(65) Prior Publication Data
US 2009/0016097 A1 Jan. 15, 2009

(51) Int. Cl.
*G11C 11/22* (2006.01)
(52) U.S. Cl. .................. 365/145; 365/158
(58) Field of Classification Search ............. 365/145, 365/158, 171; 360/59, 324.2
See application file for complete search history.

(56) References Cited

U.S. PATENT DOCUMENTS

| | | | |
|---|---|---|---|
| 7,023,206 B2* | 4/2006 | Viehland et al. | 324/249 |
| 2007/0064351 A1* | 3/2007 | Wang et al. | 360/324.2 |
| 2008/0084627 A1* | 4/2008 | Roshchin et al. | 360/59 |

FOREIGN PATENT DOCUMENTS

WO  WO 2006103065 A1  10/2006

OTHER PUBLICATIONS

Fiebig, M. et al.; Magnetoelectric effects in multiferroic manganites; Journal of Magetism and Magnetic Materials; Dec. 10, 2004.
Harris, A. B., Lawes, G.; Ferroelectricity in Incommensurate Magnets; Cornell University Library; Condensed Matter, Feb. 2, 2008.
Lottermoser, T. et al.; Magnetic phase control by an electric field; Nature; vol. 430, p. 541-544, May 17, 2004.
Wang, J. et al.; Epitaxial BiFeO3 Multiferroic Thin Film Heterostructures; Science; Mar. 14, 2003; vol. 299. No. 5613, pp. 1719-1722; abstract.

* cited by examiner

*Primary Examiner*—Vu A Le
(74) *Attorney, Agent, or Firm*—Tristan A. Fuierer; Moore & Van Allen, PLLC

(57) ABSTRACT

This invention relates to a device comprising at least a first ferromagnetic layer (202) and an element (204) exchange-bias coupled to this layer in at least one place through an interface (208), for controlling the magnetic state of the ferromagnetic layer (202) in the coupling place with an electrical field applied at least on the element, the element comprising a material with clamped antiferromagnetic and ferroelectric characteristics.

16 Claims, 4 Drawing Sheets

MAGNETOELECTRIC DEVICE AND METHOD FOR WRITING NON-VOLATILE INFORMATION INTO SAID MAGNETOELECTRIC DEVICE

BACKGROUND OF THE INVENTION

This patent relates to a magnetoelectric device, particularly a memory and/or a logic element, and to a method for writing non-volatile information into said magnetoelectric device.

Developments in magnetoelectronics, also known as spintronics (also known as spin-based electronics) have being important in the recent years. Anisotropic magnetoresistance sensors (AMR) are being widely used to determine magnetic field strengths and/or its direction. Two other kinds of spintronics devices, memories and sensors, are under development.

An anisotropic magnetoresistance (AMR) sensor is a magnetic sensor based on the dependence of the electric resistance of a soft ferromagnetic layer on the angle formed by its magnetization and the direction of the measuring electric current.

For example, GMR (Giant Magnetoresistance) sensors are being used extensively in the read heads in modern hard drives and Magnetic Tunnel Junctions (MTJ) in non-volatile, magnetic random access memory (MRAM).

A GMR is made with at least two layers of ferromagnetic material separated by a non magnetic metal. FIG. 1A and FIG. 1B are schematic view of a basic GMR comprising two magnetic layers 100 and 102 separated by a metallic layer 104 in two different states.

In FIG. 1A, the magnetization 106 of the magnetic layer 100 and the magnetization 108 of the magnetic layer 102 are antiparallel. Then, the electric resistance of this component is high (High-Resistance state).

In FIG. 1B, after applying a magnetic field 110, the magnetization 108 of the magnetic layer 102 is aligned with the magnetization 106 of the magnetic layer 100. Then, the resistance of this GMR goes down (Low-Resistance state).

Similarly, a magnetic tunnel junction (MTJ) is formed, at least, by two layers of ferromagnetic material separated by a thin insulating layer. The electrical flow across the MTJ depends on the relative orientation of the magnetization of the ferromagnetic layers. Typically, when these magnetizations are parallel the resistance of the MTJ is in the Low-Resistance state whereas when the magnetizations are antiparallel, the resistance of the MTJ is in the High-Resistance state.

The distinct values of the Low and High-resistance states of the MTJ can be used to determine the magnetic state of the ferromagnetic electrodes. Also, changing the relative orientation of the ferromagnetic electrodes can modify the resistance state of the MTJ.

These addressable and readable two resistance states of a MTJ are therefore usable to store information (High resistance, Low-resistance; "1" or "0"). An electric current is needed to determine the High or Low resistance states of the MTJ. Electric power is not required to keep the state of the MTJ as it is only determined by the relative orientation of the magnetization of the electrodes. Information is thus remnant.

Information in MTJ is written by changing the orientation of the magnetization of one of the ferromagnetic layers (free layer) with respect to the other one, which is kept fixed (pinned). MRAMs comprise arrays of MTJ. The orientation of magnetization of the free magnetic layer is commonly controlled by an external magnetic field created by a pair of current-carrying wires (bit and word lines).

FIG. 1C shows schematically a known MRAM where information can be memorized producing a magnetic field in different points of a matrix using intersections of electrical conductors. For example, to write a '1' in the place 160, a current 153 is created in the conductor 152 and a current 155 is created in the conductor 154, creating a maximum field in the place 160.

These MRAMs need power to be written because they need the current to create the magnetic field (so-called Oersted field) that will be used to change the field on a place of the device. Joule heating takes place because of the use of electric current to address the magnetic state of a MTJ. Energy dissipation is a drawback in terms of energy consumption from power supply and limits higher integration of MTJ in MRAM's.

And as it can be shown in FIG. 1C, when introducing currents 153 and 155 in order to create the magnetic field in the place 160 of a MRAM, it can also affect neighboring places 161, 162, 163 and 164 on the MRAM, changing their magnetizations too (problem known in the art as crosstalk).

Document WO2006/103065 discloses a magnetoresistive element and a method for writing information. The method is based on reported dependence of the exchange bias between adjacent ferromagnetic and magnetoelectric layers. Cooling the magnetoelectric across its antiferromagnetic order temperature ($T_N$) under simultaneous application of suitable Electric and Magnetic fields (E and H) allows modifying the antiferromagnetic boundary condition and subsequently the exchange bias. The product of the field strengths of the two fields during freezing determines the ability to change the antiferromagnetic boundary condition. A characteristic of this WO2006/103065 known magnetoresistive element is that the need of maintaining the Electric field during the cooling will eventually lead to energy consumption

SUMMARY OF THE INVENTION

One of the objects of this invention is to provide a device that overcomes these limitations (energy dissipation and consumption, and current-induced crosstalk) and to propose a new strategy for controlling the magnetic state of this magnetic device.

Another object of this invention is to provide a magnetoelectric device whose magnetic state, in at least one part of said magnetoelectric device may be controlled with low energy consumption.

Another object of this invention to provide a method for writing non-volatile information into a magnetoelectric device.

According to a first aspect of this present invention, this invention concerns a device comprising at least a ferromagnetic layer and an element exchange-bias coupled to the ferromagnetic layer in at least one place through an interface, for controlling the magnetic state of the ferromagnetic layer in the coupling place with an electrical field applied at least on the element, the element comprising a material with coupled antiferromagnetic and ferroelectric characteristics.

Thanks to the clamping of the antiferromagnetic and ferroelectric characteristics of the element, the magnetic domain structure of the material can be modified when modifying the ferroelectric domain structure of said material, in particular when changing the electrical polarization of the ferroelectric, i.e. when applying an electrical field.

In the present invention, taking advantage of the exchange-bias coupling of the ferromagnetic layer and the element, the magnetic state of the ferromagnetic layer is modified by an electric field; and then information can be written using an electric field.

Thanks to this invention, the magnetization of the ferromagnetic layer is controlled by an electrical field and not a magnetic field.

No Oersted field is required and thus no current flow and subsequent Joule heating takes place. Therefore the energy needed to change the magnetic state of the ferromagnetic layer in this invention is radically lower than the one needed to create a current susceptible to create the necessary magnetic field used to change the magnetization of the ferromagnetic layer.

Moreover, as the electrical field can be applied locally, and does not need bit and word lines that drive current across the array of MTJ's in a MRAM, the precision on the place where the magnetization of the ferromagnetic layer is changed is much higher in this invention, insofar diminishing the crosstalk issue.

It is essential for optimal exploitation of the multiferroic character of a material that its ferroic properties (magnetic and electric, in the present context) are coupled and eventually clamped.

In an embodiment, the material comprised in the element, is hexagonal $YMnO_3$ oxide that has got clamped antiferromagnetic and ferroelectric characteristics.

Any other multiferroic material displaying clamping or strong coupling of their magnetic and ferroelectric properties could be also alternatively used in other embodiments. Examples include: $R^1MnO_3$ oxides with hexagonal structure wherein $R^1$ may be any element from Ho to Lu, Y or Sc, or orthorhombic oxides such as $TbMnO_3$ or other non-manganese containing oxides such as $BiFeO_3$.

In an embodiment, the first ferromagnetic layer is included in a GMR or MTJ-like heterostructure with a second ferromagnetic layer separated from the first ferromagnetic layer by an intermediate layer. For example, these three layers could form a magnetoresistance GMR or a magnetic tunnel junction MTJ. In another embodiment, the first layer of ferromagnetic material is included in an anisotropic-magnetoresistance (AMR) based magnetoresistive sensor.

A device according to this first aspect of the invention may comprise two suitable metallic electrodes for applying an electric field E at least across the element. As the first ferromagnetic layer may be electrically conducting, one of the electrodes may be connected to this first ferromagnetic layer, the other one being connected to the element.

A second aspect of this invention concerns a method for writing non-volatile information by application of an electric field into a device according to the first aspect of the invention, the method comprising the following steps:

a. heating of the device under the presence of a magnetic field, b. cooling of the device under the presence of a magnetic field without applying any electric field by exploiting the intrinsic electric anisotropy of a ferroelectric material, c. writing information by application of an electric field at least on the element after the cooling in order to modify the magnetic state of the first layer.

Thanks to this invention, an electric field is just needed while writing the information after the cooling and no electric field is required during cooling, reducing the power consumption during the process of information storage.

BRIEF DESCRIPTION OF THE DRAWINGS

These and other aspects of the invention will be apparent from and elucidated further with reference to the embodiments described by way of example in the following description and with reference to the accompanying drawings, in which.

DETAILED DESCRIPTION OF THE PREFERRED EMBODIMENTS

Figure 1A:
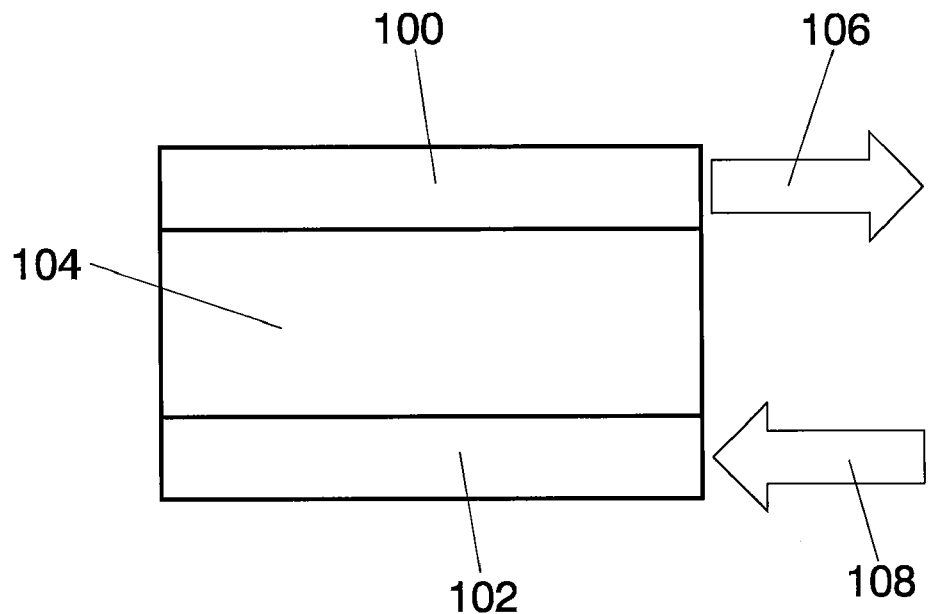
FIG. 1A and FIG. 1B are two schematic view of a prior art basic GMR.
Figure 1B:
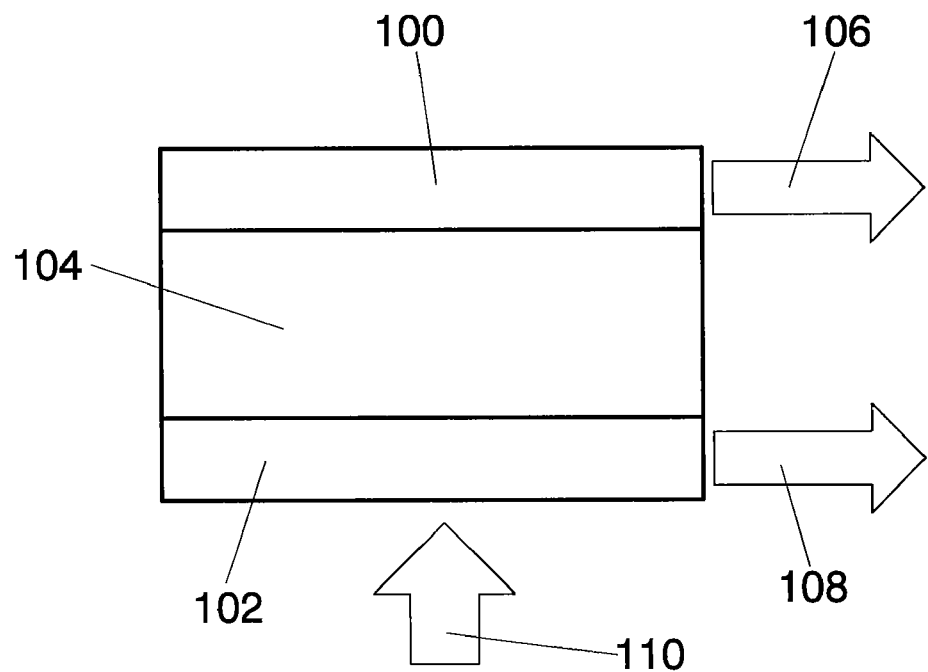
Figure 1C:
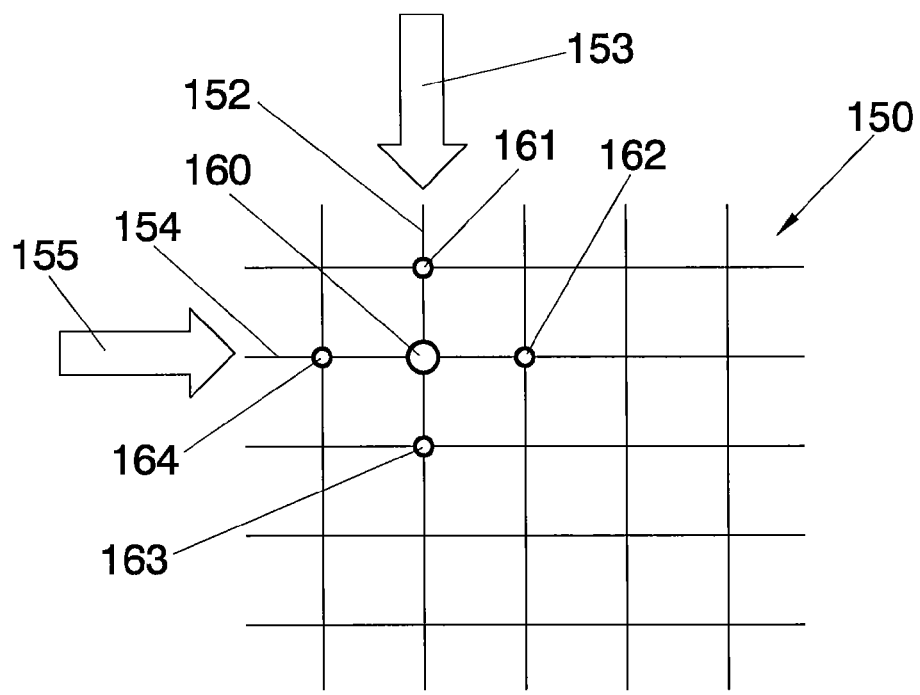
FIG. 1C is a schematic view of a prior art MRAM memory array.
Figure 2:
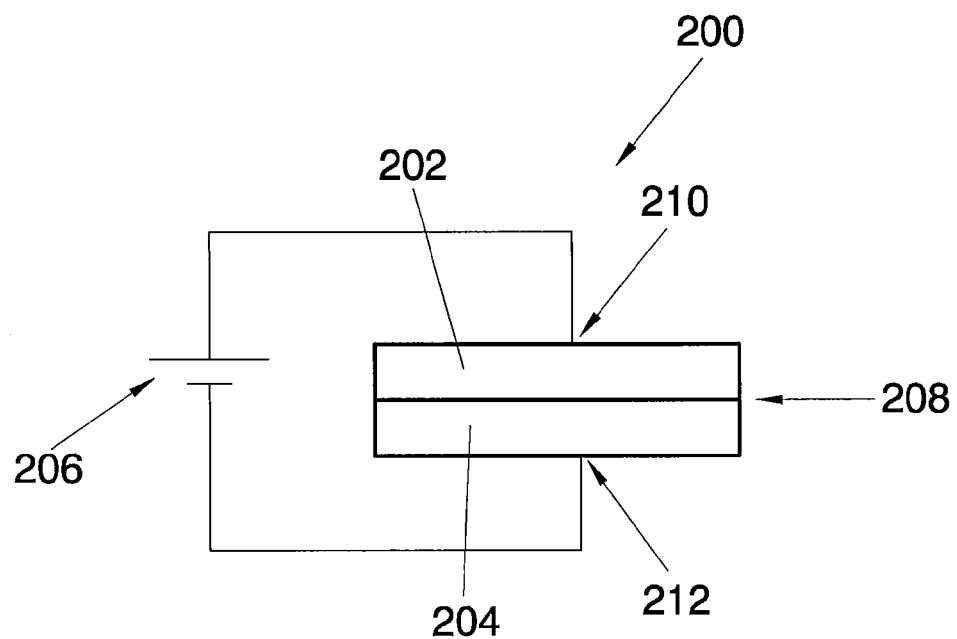
FIG. 2 shows schematically a device according with the invention.

FIG. 2 is a schematic drawing of a device according to one embodiment of the invention. A ferromagnetic layer 202 is coupled with an element 204 that is, in this embodiment, a layer of hexagonal $YMnO_3$ oxide, example of a material having simultaneously antiferromagnetic (AF) and ferroelectric (FE) characteristics.

Hexagonal $YMnO_3$ has been used as an example of biferroic material to create a layer that is, for this embodiment, the element of the invention. Hexagonal $YMnO_3$, in bulk form, is ferroelectric up to around 900 K and exhibits an antiferromagnetic character at low temperature ($T_N$~90 K). In $YMnO_3$ single crystals, antiferromagnetic and ferroelectric domains are clamped.

Antiferromagnetic $YMnO_3$ is used to pin the magnetic state of a suitable ferromagnetic layer (FM) and to exploit its ferroelectric character and the clamping between FE and AF order parameters to tailor the properties of the ferromagnetic layer.

In an embodiment, a layer of NiFe (Permalloy-Py) is used as FM layer 202 and coupled (via an exchange-bias) with antiferromagnetic epitaxial $YMnO_3$ thin film grown (0001) textured, which displays ferroelectric character and remnant electric polarization directed along the [0001] direction. Other ferromagnetic materials, such as CoFeB, can be alternatively used.

Exchange bias at interface 208 between ferromagnetic and antiferromagnetic materials is recognized to be associated with the existence of a net magnetization at the surface of the AF and to the development of a unidirectional magnetic anisotropy that pins the magnetization of an upper-grown ferromagnetic layer.

As a consequence, when a magnetic field is applied parallel to the interface, the magnetization of the ferromagnetic layer does not follows (neglecting the anisotropy of the FM layer 202) the external field $H_a$ but the $H_a+H_{eb}$ vector sum, where $H_{eb}$ is the exchange-bias field.

This behavior, and thus the presence of a finite exchange-bias field $H_{eb}$, is most commonly evidenced by a shift along the magnetic field axis of the magnetization loop of the FM layer 202.

However, it also dramatically effects on other properties, such as the angular dependence of anisotropic magnetoresistance (AMR) of the FM layer 202 when the external magnetic field is rotated; the exchange-bias field $H_{eb}$ can be monitored and determined by measuring the angular dependence of the electrical resistance of the FM layer when rotating an in-plane magnetic field $H_a$ with respect the measuring current direction. Similarly, the electric resistance of the AMR sensor will vary if the acting $H_{eb}$ field is modified.

Experimentally, the exchange bias between the multiferroic element (i.e YMnO$_3$) and the FM layer (i.e Py) may be tuned as a function of a biasing electric field applied across the multiferroic element.

To apply an electric field across the biferroic element, two metallic electrodes 210,212 are needed. For that purpose, a thin epitaxial layer of the multiferroic element (i.e. YMnO$_3$) is sandwiched between metallic electrodes. In an embodiment, thin layers of Pt and Py will act as metallic electrodes.

In an embodiment, YMnO$_3$ (0001) films, 90 nm thick, with hexagonal structure are grown by pulsed laser deposition on SrTiO$_3$ (111) substrates buffered with a thin epitaxial Pt layer (8 nm) as bottom metallic electrode.

This heterostructure is then covered by a Py film (15 nm). X-ray diffraction experiments indicated that the Pt and YMnO$_3$ films are epitaxial, with (111) and c-axis out-of-plane orientation, respectively.

During the growth of YMnO$_3$, a mask may be used—partially covering the bottom Pt electrode—for subsequent electric contacting.

The magnetization versus magnetic field curves may be recorded to confirm the existence of an exchange bias field $H_{eb}$ acting on Py.

Figure 3:
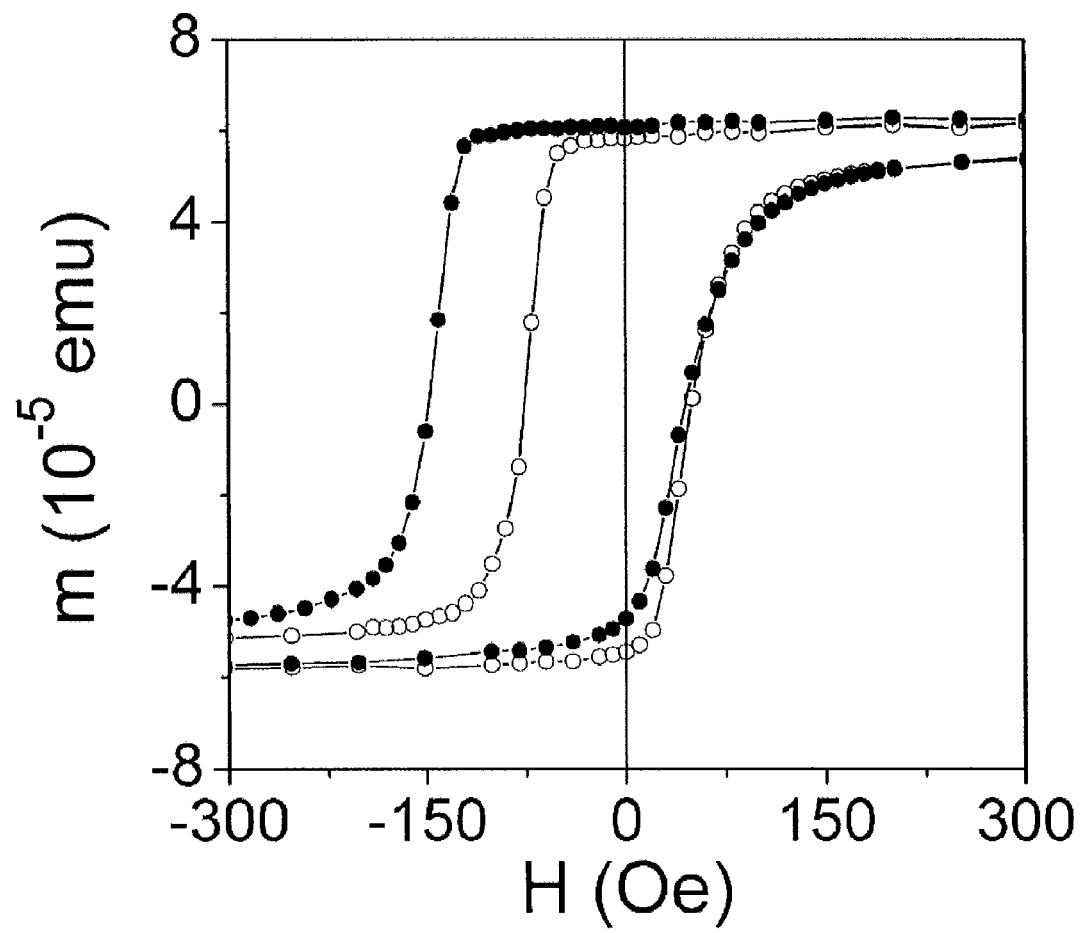
FIG. 3 shows schematically the magnetic moment of a ferromagnetic layer comprised in a device according to the invention depending on several parameters.

FIG. 3 shows experimental measurements of magnetic moment (m) of a Py FM layer 202 versus applied magnetic (H) measured at 2 K after a cooling the YMnO3/Py sample under a 3 kOe field.

Solid and open symbols correspond to measurements performed under a bias voltage of V=0 and 1.2 V respectively.

It can be seen that it is possible to change the magnetization (even its sign) of the Py FM layer 202 by just changing the bias voltage. Then the magnetization of the FM layer 202 can be reversed by applying a suitably large electric field.

In an embodiment, four (in-line) electric contacts on Py may be used to perform electric transport and anisotropic magnetoresistance measurements. The presence of an exchange bias field $H_{eb}$ acting on Py has been verified. Additional electrical contacts on Py and Pt may be made for electric biasing the Py/YMnO$_3$/Pt sandwich.

Using the embodiments described herein, subsequent measurements of the exchange-bias field when biasing the Py/YMnO$_3$/Pt sandwich with a suitable voltage indicate strong changes of the exchange-bias field which translates into changes of the magnetization of the FM layer.

The magnetic exchange bias of these embodiments and thus the system magnetization can be strongly modified by an electric field.

In an embodiment, the electric resistance of the FM layer, for a given angle between the applied external field $H_a$ and the measuring current is modified by applying a suitable electric field.

Figure 4:
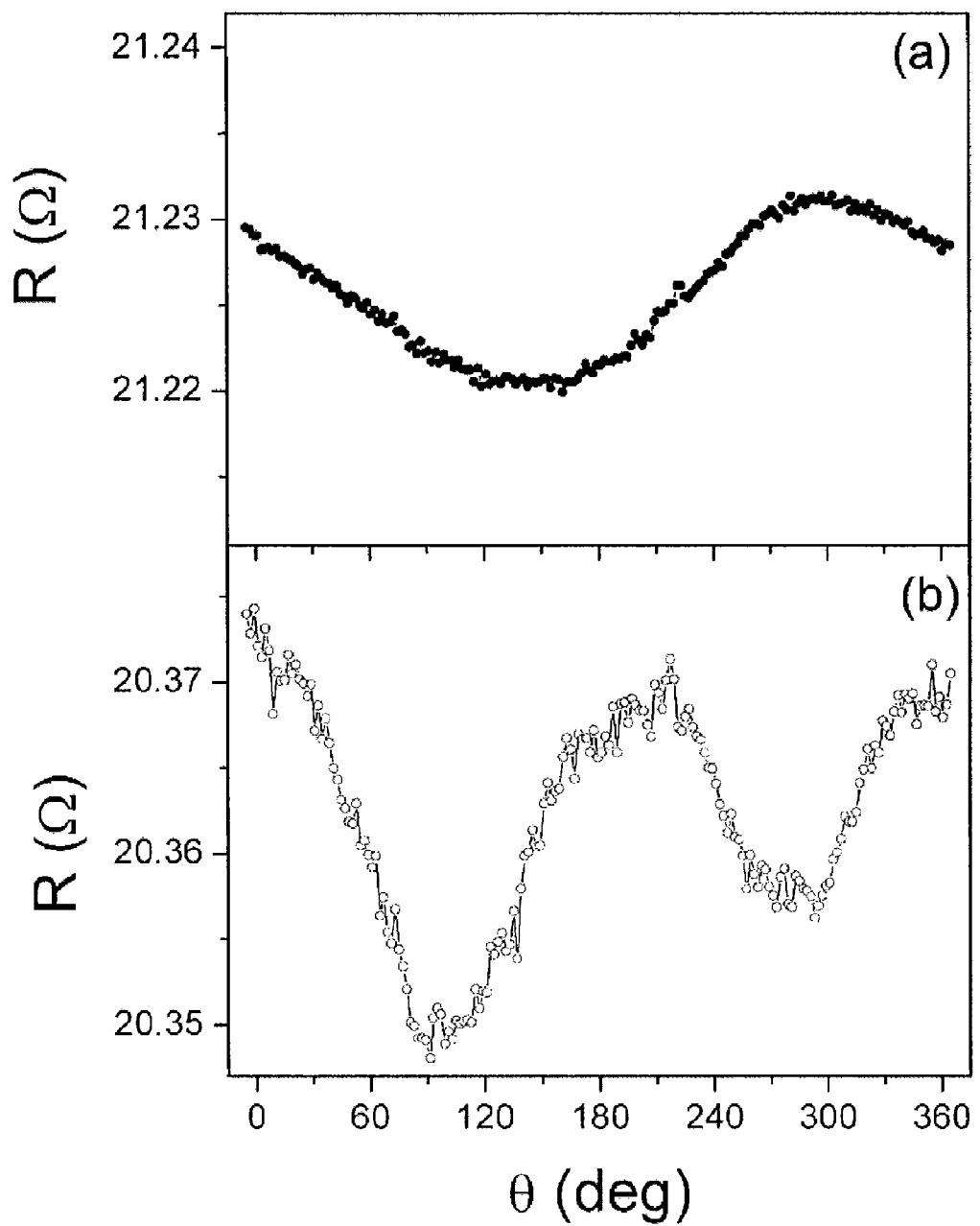
FIG. 4 shows schematically the electric resistance of a ferromagnetic layer comprised in a device according to the invention depending on several parameters.

FIG. 4 shows experimental measurements done on one embodiment of the invention: FIG. 4 shows dependence of the electric resistance (R), at 5 K, of the Py FM layer on the angle (θ) between the measuring electric current and an applied magnetic field (in the plane of the film) of 50 Oe.

Data in panels (a) and (b) have been recorded under a bias voltage of V=0 and 1.8 V respectively There is a clear genuine electric field effect on the exchange bias in YMnO3/Py heterostructures. The suppression of magnetic exchange bias by electric poling of the underlying YMnO$_3$ ferroelectric layer indicates a substantial modification of the antiferromagnetic domain structure which is driven by the electric field. The microscopic origin of this surprising effect can not be conclusively inferred from experiments.

An electric field is then used to tune the exchange-bias coupling in AF/FM heterostructures and eventually the magnetic switching of the FM layer. GMR or MTJ may be then controlled by a method according to the second aspect of the invention.

In an embodiment, the biferroic antiferromagnetic and ferroelectric YMnO$_3$ layer is used to bias the FM layer, with the ultimate goal of fully exploiting its ferroelectric character and subsequent hysteretic behavior.

This invention may be used to actuate an AMR sensor or a GMR or an MTJ-like heterostructure in spintronics.

The invention claimed is:

1. A device comprising at least a first ferromagnetic layer (202) and an element (204) exchange-bias coupled to this layer in at least one place through an interface (208), for controlling the magnetic state of the ferromagnetic layer (202) in the coupling place with an electrical field applied at least on the element, the element comprising a material with clamped antiferromagnetic and ferroelectric characteristics.

2. The device according to claim 1, wherein the material with clamped antiferromagnetic and ferroelectric characteristics comprises: hexagonal YMnO$_3$ oxide; any R$^1$MnO$_3$ oxides with hexagonal structure wherein R$^1$ is any element from Ho to Lu, Y or Sc; orthorhombic structure TbMnO$_3$; or BiFeO$_3$.

3. The device according to claim 1, wherein the first ferromagnetic layer (202) is included in anisotropic magnetoresistance (AMR) sensor or in a Giant Magnetoresistance(GMR) or Magnetic Tunnel Junctions(MTJ)-like heterostructure with a second ferromagnetic layer separated from the first ferromagnetic layer by an intermediate layer.

4. The device according to claim 1, wherein the device comprises two suitable metallic electrodes (210,212) for applying an electric field E at least across the element.

5. The device according to claim 2, wherein the first ferromagnetic layer (202) is forming the ferromagnetic layer of an AMR sensor or the ferromagnetic layer of a GMR or MTJ-like heterostructure with a second ferromagnetic layer separated from the first ferromagnetic layer by an intermediate layer.

6. The device according to claim 2, wherein the device comprises two suitable metallic electrodes (210,212) for applying an electric field E at least across the element.

7. The device according to claim 3, wherein the device comprises two suitable metallic electrodes (210,212) for applying an electric field E at least across the element.

8. The device according to claim 5, wherein the device comprises two suitable metallic electrodes (210,212) for applying an electric field E at least across the element.

9. A method for writing non-volatile information by application of an electric field into a device comprising at least a first ferromagnetic layer (202) and an element (204) exchange-bias coupled to this layer in at least one place through an interface (208), for controlling the magnetic state of the ferromagnetic layer (202) in the coupling place with an electrical field applied at least on the element, the element comprising a material with clamped antiferromagnetic and ferroelectric characteristics, the method comprising the following steps:

a. heating of the device under the presence of a magnetic field,
b. cooling of the device under the presence of a magnetic field without applying any electric field by exploiting the intrinsic electric anisotropy of a ferroelectric material,
c. writing information by application of an electric field at least on the element after the cooling in order to modify the magnetic state of the first layer.

10. The method according with claim 9, wherein the material with clamped antiferromagnetic and ferroelectric characteristics comprises: hexagonal $YMnO_3$ oxide; any $R^1MnO_3$ oxides with hexagonal structure wherein $R^1$ is any element from Ho to Lu, Y or Sc; orthorhombic structure $TbMnO_3$; or $BiFeO_3$.

11. The method according to claim 9, wherein the first ferromagnetic layer (202) is forming the ferromagnetic layer of an AMR sensor or the ferromagnetic layer of a GMR or MTJ-like heterostructure with a second ferromagnetic layer separated from the first ferromagnetic layer by an intermediate layer.

12. The method according to claim 9, wherein the device comprises two suitable metallic electrodes (210,212) for applying an electric field E at least across the element.

13. The method according to claim 10, wherein the first ferromagnetic layer (202) is forming the ferromagnetic layer of an AMR sensor or the ferromagnetic layer of a GMR or MTJ-like heterostructure with a second ferromagnetic layer separated from the first ferromagnetic layer by an intermediate layer.

14. The method according to claim 10, wherein the device comprises two suitable metallic electrodes (210,212) for applying the electric field E at least across the element.

15. The method according to claim 11, wherein the device comprises two suitable metallic electrodes (210,212) for applying the electric field E at least across the element.

16. The method according to claim 13, wherein the device comprises two suitable metallic electrodes (210,212) for applying the electric field E at least across the element.

* * * * *